United States Patent [19]

Koyangi

[11] 3,868,609

[45] Feb. 25, 1975

[54] CHANNEL SELECTOR

[75] Inventor: Yukio Koyangi, Osaka, Japan

[73] Assignee: Matsushita Electric Industrial Co., Ltd., Osaka-fu, Japan

[22] Filed: Oct. 18, 1972

[21] Appl. No.: 298,493

[30] Foreign Application Priority Data

Oct. 19, 1971 Japan .............................. 46-83186

[52] U.S. Cl. ........................ 334/11, 334/15, 334/16

[51] Int. Cl. ............................ H03j 3/04, H03j 3/06

[58] Field of Search .......................... 334/11, 15, 16

[56] References Cited

UNITED STATES PATENTS

| | | | |
|---|---|---|---|
| 3,528,043 | 9/1970 | Richter et al. | 334/15 X |
| 3,575,661 | 4/1971 | Slavik | 334/15 |
| 3,673,523 | 6/1972 | Russell | 334/15 |
| 3,679,980 | 7/1972 | Midgley et al. | 334/15 |
| 3,705,356 | 12/1972 | Russell | 334/16 |
| 3,715,671 | 2/1973 | Worcester | 334/11 |

*Primary Examiner*—Alfred E. Smith
*Assistant Examiner*—Saxfield Chatmon, Jr.
*Attorney, Agent, or Firm*—Milton J. Wayne

[57] ABSTRACT

A channel selector comprising an electronic tuner utilizing a voltage variable-capacity element as a tuning element; means for generating a plural number of channel selecting voltages corresponding to the receiving channels; a switch for selectively taking out said plural number of channel selecting voltages; a plural number of output terminals provided on said switch for dividing a receiving channel into a plural number of groups; and resistances for AFC sensitivity compensation connected between said plural number of output terminals wherein AFC voltage compensated by the resistances for AFC compensation is superimposed to the electronic tuner; the channel selector of this invention outstanding effects when used as a channel selector for a TV image receiver.

8 Claims, 5 Drawing Figures

CHANNEL SELECTOR

BACKGROUND OF THE INVENTION:

The present invention relates to a channel selector of the well known electron tuning system type utilizing a voltage variable-capacity element as a tuning element.

In conventional electronic tuning channel selectors of this kind, a plural number of preset channel selecting voltages are supplied to the voltage variable-capacity element in turn by switching the channels by a channel selecting switch, while the switch controlling voltage of the tuning element of the tuning circuit such as an electronic tuner is also switched.

Thus, it is difficult to accurately and simply carry out the indication of tuning channels in conventional devices.

On the other hand, as in the case of Japan or the United States of America where the number of channels is large, (for example, in the case of TV broadcasting in Japan, there are 12 channels in VHF, and there are 50 channels in UHF), a great number of contacts the channel selecting voltage switch and a great number of presetting circuits of channel selecting voltages are required and therefore the structure the channel selector is complicated, and at the same time, the channel selector is difficult to operate.

On the other hand, in order to carry out fine adjustments, the reduction gear ratio of the variable resistance for presetting channel selecting voltages must be arranged to be large.

In addition, in conventional devices, the voltage for AFC is directly superimposed on the voltage for selecting channels, and therefore the AFC voltage to be given to the voltage variable-capacity element is changed by the position of the adjustment of the movable contact of the variable resistor for presetting channel selecting voltage, and the AFC sensitivity differs channel by channel.

The conventional devices have a number of drawbacks as mentioned above.

The present invention is intended to remove all of the disadvantages of the conventional devices and one of the objects of the present invention is to simplify the means for presetting the tuning voltage, and to provide a channel selector which is capable of easily and accurately carrying out the presetting of tuning voltages.

Next, another object of this invention is to provide a channel selector capable of easily selecting and setting desired tuning channels for optional channels in advance.

A further object of this invention is to provide a channel selector having excellent AFC characteristics over the entire channel range.

A further object of this invention is to provide a channel selector capable of accurately and easily carrying out the channel indication of all the channels.

In accordance with the present invention, a plural number of channel selecting voltages corresponding to the receiving channels are generated and said voltages are divided into a plural number of appropriate groups, and a plural number of common output terminals for selectively taking out said voltages group by group, are provided. The resistors for AFC sensitivity compensation are provided between the plural number of output terminals. The above mentioned channel selecting voltages selected and AFC voltage compensated with the resistance for AFC sensitivity compensation are superimposed and supplied to the voltage variable-capacity element of the tuner. The above mentioned means for generating the plural number of channel selecting voltage is composed of means for obtaining the block voltage corresponding to the receiving channel and means for obtaining the fine adjustment voltage corresponding to the receiving channel.

Therefore, it is possible to carry out the fine adjustment of the channel selecting voltages group by group without adjusting the channel selecting voltages corresponding to the whole channels by one control device, and therefore it is possible to secure precise voltage control.

Other objects and characteristics of the present invention are explained in accordance with the attached drawings and the detailed explanation of the embodiments of this invention.

BRIEF EXPLANATION OF THE DRAWINGS:

In the attached drawings;

FIG. 1 shows the electric circuit of the channel selector for selecting Japanese TV channels as an embodiment of this invention;

In FIG. 1, (1) and (2) are the interlocked switch, and the switch (1) has the common output terminal (3) for VHF lower channels (from Channel 1 to Channel 3), the common output terminal (4) for VHF intermediate channels (from Channel 4 to Channel 9), the common output terminal (5) for VHF higher channels (from Channel 10 to Channel 12), the common output terminal (6) for UHF (from Channel 13 to Channel 62), individual terminal (7) for each channel, and the contact (8) for switching the common output terminals (3), (4), (5), and (6) and the individual terminal (7); and the switch (2) has the common output terminal (9), the common output terminal (10) for VHF lower channels, the common output terminal (11) for VHF intermediate and higher channels, the common output terminal (12) for UHF, and the contact (13) for switching the conduction of the common output terminal (9) and the common output terminals (10), (11), and (12). Said contact (8) and said contact (13) are interlocked. A switch, (not shown in FIG. 1), for mechanical or electrical channel indication is interlocked to said switches (1) and (2). It is, of course, possible to substitute said switches (1) and (2) for the electronic switching circuit capable of performing the same function as the switches (1) and (2), although the switches (1) and (2) are of mechanical structure in the attached diagram. When the switches are of mechanical structure, switching can be done by a driving mechanism such a motor, and when the switches are of electronic structure, switching can be done by electric signals such as pulse. It is also possible to provide a stop-presetting mechanism for stopping the contacts (8), (13) only at the desired receiving channel in carrying out the switching of the switches (1) and (2) for selecting the desired optional receiving channel among the entire broadcasting channels in order to simplify the channel selection.

Figure 1:
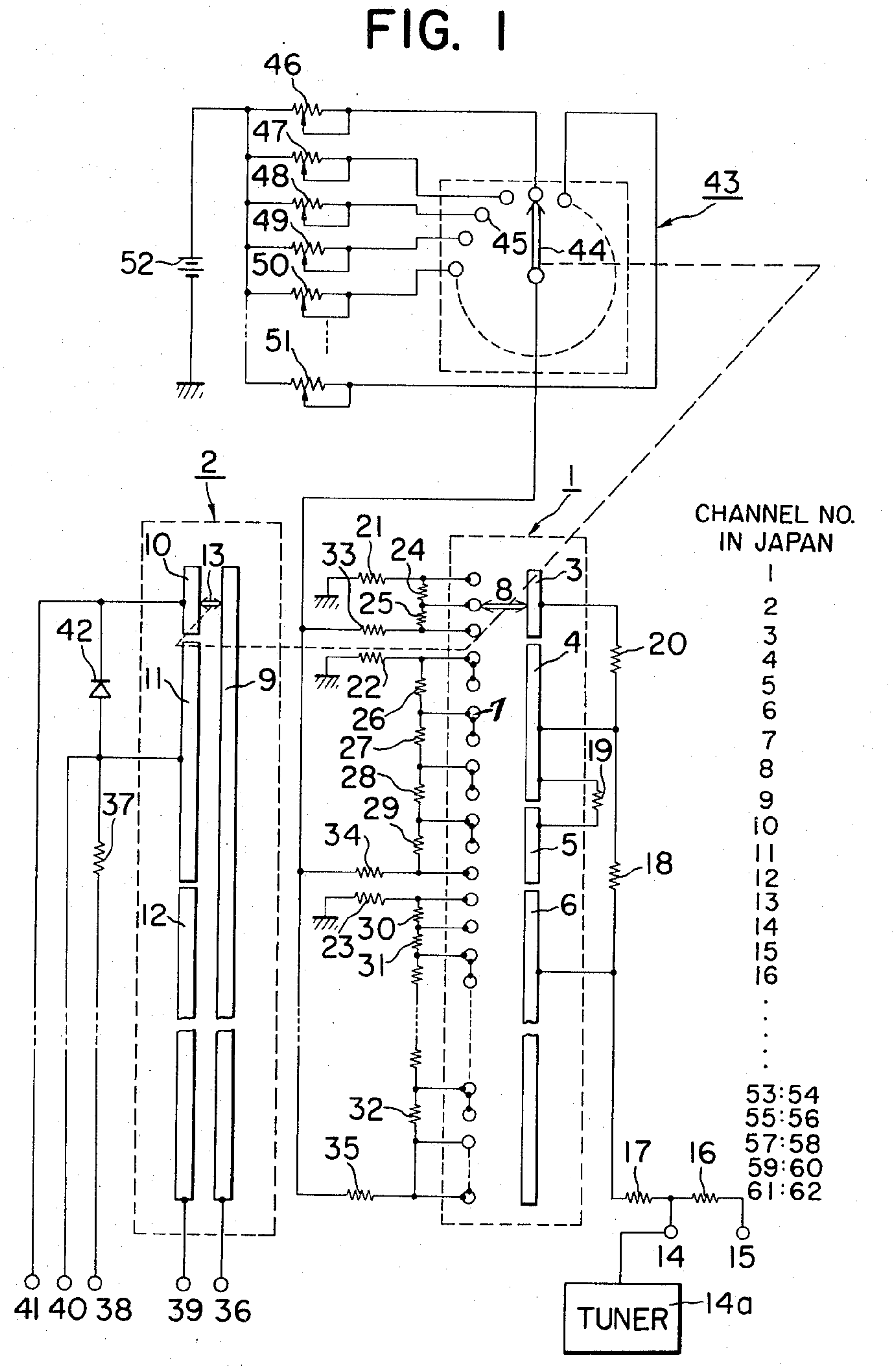
FIG. 1 is a circuit showing the electric connection of the channel selector as an embodiment of this invention.

The above mentioned stop-presetting mechanism has another switch (not shown) interlocked with the switches (1) and (2), and, by the switch, the stop-channel discerning signal (i.e., the signal for discerning whether voltage is given to the conductor of said new switch for each channel and for stopping on the only channel to which voltage is given) is made to control the electronic switch by an electric signal or the above mentioned driving mechanism to stop only at the desired channel, or the desired channel is mechanically selected, which is generally used in the conventional remote control mechanisms, and can be easily realized.

The switch (1) is the switch for AFC sensitivity switching and channel selection voltage, and the grouping of the common output terminals (3), (4), (5) and (6) is done in accordance with the grouping of the channel selecting voltages, and the grouping of AFC sensitivity. The common output terminals (3), (4), (5), and (6) are provided with the channel selecting voltage output terminal (14) for giving the channel selecting voltage to be given to the voltage variable-capacity element of the electronic tuner 14a, and the AFC voltage input terminal (15) for receiving AFC voltage from the AFC voltage generator, and the resistor (16) is provided between the channel selecting voltage output terminal (14) and the AFC voltage input terminal (15), and the resistor (17) is provided between the channel selecting voltage output terminal (14) and the common output terminal (6) for UHF, and the resistor (18) is provided between the common output terminal (6) for UHF and the common output terminal (4) for VHF intermediate channels, and the resistor (19) is provided between the common output terminal (4) for VHF intermediate channels and the common output terminal (5) for VHF higher channel, and the resistor (20) is provided between the common output terminal (4) for VHF intermediate channels and the common output terminal (3) for VHF lower channels.

On the side of the individual terminal (7) for each channel, the resistors (21), (22), (23) are connected between the individual terminals for Channels 1, 4 and 13, and the earth; the resistors (24) ~ (32) are provided respectively between Channel 1 and Channel 2, between Channel 2 and Channel 3, between Channels 4, 5 and Channels 6, 7, between Channels 6, 7 and Channels 8, 9, between Channels 8, 9 and Channels 10, 11, between Channels 10, 11 and Channels 12, 13, between Channel 14 and Channels 15, 16, between Channels 15, 16 and Channels 17, 18, between Channels 53 ~ 56 and Channels 57 ~ 62 on the individual terminals, and the resistors (33), (34), and (35) are connected to the individual terminals for Channels 3, 12, 61, and 62.

The switch (2) is a switch for switching switchcontrolling voltage for switching the channel selecting element of electronic tuner to VHF lower channels, VHF intermediate and higher channels, and for UHF, and has +B voltage input terminal (36) connected to the common output terminal (9), −B voltage input terminal (38) connected to the common output terminal (12) for UHF through the resistor (37), UHF switch controlling voltage output terminal (39) connected to the common output terminal (12) for UHF, switch controlling voltage output terminal (40) for VHF intermediate higher channel connected to the common output terminal (11) for VHF intermediate and higher channels, switch controlling voltage output terminal (41) for VHF lower channels connected to the common output terminal (10) for VHF lower channels, and the diode (42) connected between the common output terminal (10) for VHF lower channel and the common output terminal (11) for VHF intermediate and higher channels.

On the other hand, (43) is the switch for switching the variable resistor for presetting voltage for channel selection.

It is possible to correlate the channel to be stopped and the switch to switch the variable resistor for presetting at 1:1 by such a structure that the movable member (44) is switched in counter-clock wise direction one contact after another by using the above mentioned stop channel discerning signals every time when the contacts (8) and (13) of the switches (1) and (2) stop while the switches (1) and (2) are revolved in the direction from Channel 1 onwards. The movable member (44) is connected to the common contact of the resistor (33), (34) and (35), and the variable resistors (46) ~ (51) for voltage presetting for channel selection, and the other ends of the variable resistor (46) ~ (51) are commonly connected to the positive pole of the power source (52).

In the following paragraphs, the operations of the embodiment of this invention of the above given structure, are explained.

Figure 2:
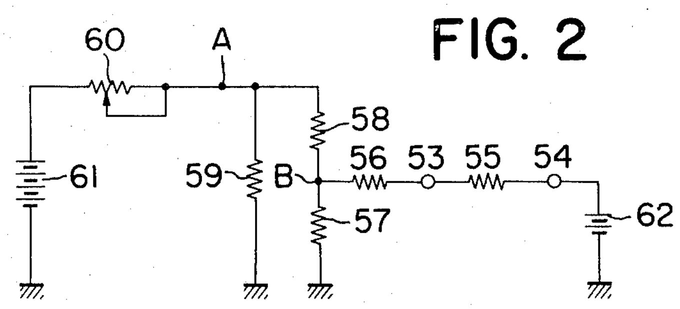
FIG. 2 is an equivalent network for explaining the same device as in FIG. 1.

FIG. 2 shows the equivalent circuit of the channel selector shown in FIG. 1, and in FIG. 2, (53) corresponds to the voltage terminal (14) for channel selection in FIG. 1, (54) corresponds to the AFC voltage input terminal (15) of FIG. 1, (55) corresponds to the resistor (16) of FIG. 1, (56) corresponds to the resistors (17) ~ (20) of FIG. 1, (57) corresponds to the resistors (21), (24) of the group of the resistors (21), (24), (25), (33) of the channel to which the contact (8) is connected, (58) corresponds to the resistors (25), (33) of FIG. 1, (59) corresponds to the combined resistance of the resistor group (resistors (22), (23), (26) ~ (32), (34), (35) of the channel to which the contact (8) is not connected, (60) corresponds to (46) of FIG. 1 when it is one of the variable resistors (46) ~ (51), (61) corresponds to the power source (52) for channel selection, and (62) is the voltage for AFC.

For the sake of explanation, concrete numerical values are given. Namely, the voltage for channel selection to be given to the variable-capacity element for tuning is determined as follows;

| CHANNEL | CHANNEL SELECTING VOLTAGE (V) |
|---|---|
| 1 | 4 |
| 2 | 6 |
| 3 | 9 |
| 4 | 4 |
| 5 | 5 |
| 6 | 6 |
| 7 | 7 |
| 8 | 8.5 |
| 9 | 10 |
| 10 | 12 |
| 11 | 15 |

-Continued

| CHANNEL | CHANNEL SELECTING VOLTAGE (V) |
|---|---|
| 12 | 18 |
| 13 | 2.5 |
| 14 | 3 |
| 15 | 3.5 |
| 16 | 4.0 |
| 17 | 4.5 |
| 18 | 5 |
| 19 | 5.5 |
| 20 | 6 |
| . | . |
| . | . |
| . | . |
| 60 | 20.4 |
| 61 | 2.2 |
| 62 | 22 |

When the respective combined resistances of the respective resistors are made equal, the following relation can be established between the resistance $R_A$ of the resistor (59), the resistance $R_B$ of the resistor (58), and the resistance $R_C$ of the resistor (57);

FORMULA $R_A = ½(R_B + R_C)$

In order to effectively superimpose the AFC voltage over the voltage for channel selection, the resistance $R_D$ of the resistor (56), and the resistance $R_E$ of the resistor (55) are determined as follows;

FORMULA $R_C << R_D + R_E$

On the other hand, the input impedance of the voltage variable-capacity element is large, and therefore the effect on the circuit may be neglected. Therefore, the combined resistance $R_{01}$ on the right hand from Point A, FIG. 2, may be represented by the following formula;

FORMULA $R_{01} \div R_A(R_B + R_C)/R_A + (R_B + R_C) = ⅓(R_B + R_C)$

The maximum channel selecting voltage is 22(V) as described above, and when it is presumed that the slidable contact of the variable resistor (60) is in the central point and the voltage on Point A of FIG. 2 is 20(V), and when the voltage of the power source (61) is presumed to be 30(V), and the resistance of the variable resistor (60) is presumed to be $R_X$, the relation of the maximum value $R_{X\ max}$ of the variable resistor (60) becomes as follows;

FORMULA $30 \times R_{01}/½R_{X\ max} + R_{01} = 20$

From the above formula, it is apparent that the following equation can be satisfied;

FORMULA $R_{X\ max} = R_{01}$

When it is presumed that the voltage on Point B of FIG. 2 is $V_0$ generated by the power source (61), and the voltage of the channel selecting voltage output terminal (53) is $V_{T1}$, $V_{T1}$ can be represented by the following formula;

FORMULA $V_{T1} \div V_0 \div 30 \cdot R_{01}/R_X + R_{01} \cdot R_C/R_B + R_C$

Therefore, the maximum value $V_{T1\ max}$ of the channel selecting voltage and the minimum value $V_{T1\ min}$ of the channel selecting voltage when the resistance of the variable resistor (60) is changed from the minimum value to the maximum value is represented as follows;

FORMULAE $V_{T1\ max} = 30 \cdot R_C/R_B + R_C$ $V_{T1\ min} = 30 \cdot ½ \cdot R_C/R_B + R_C$ Thus, the ratio of the maximum value $V_{T1\ max}$ against the minimum value $V_{T1\ min}$ of the channel selecting voltage is represented as follows;

FORMULA $V_{T1\ max}/V_{T1\ min} = 2$

Figure 3:
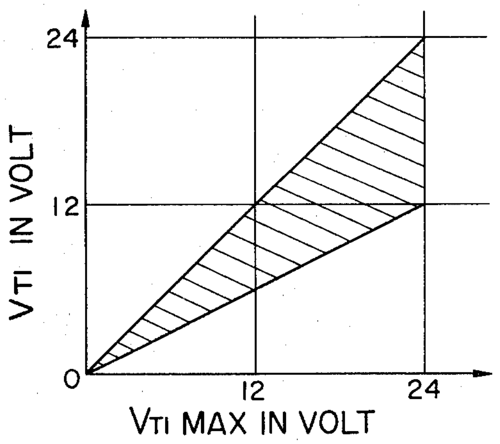
FIG. 3 is a graph of the characteristics of the maximum channel selecting voltage slotted against the channel selecting voltage for explaining the operation of the same device.

FIG. 3 shows the relation between the maximum value $V_{T1\ max}$ of the channel selecting voltage and the range of the change of channel selecting voltage $V_{T1}$ obtained by changing the variable resistor (60), and the channel selecting voltage $V_{T1}$ changes within the shaded portion of the diagram. Consequently, as the channel selecting voltage $V_{T1}$ is larger, the range where said voltage can be adjusted, becomes larger. Thus, the channel selector of this invention can be preferably adopted in such a case that the irregularity of the characteristics of voltage variable-capacity element is desired to be corrected, in view of the fact that the range of voltage change for compensation is greater as the applied voltage is greater. As the applied voltage becomes larger, the capacity of the voltage variable-capacity element becomes smaller, and the voltage variable-capacity element has the can be connected in parallel.

When it is presumed that the channel selecting voltage is changed by $\pm\Delta V_{T1}$ with the central value $V_{T0}$ thereof as the resistance of the variable resistor (60) is changed, the following relation is obtained;

FORMULA $V_{T0} + \Delta V_{T1}/V_{T0} - \Delta V_{T1} = V_{T1\ max}/V_{T1\ min} = 2$ as described above; and the following equation is obtained;

FORMULA $\Delta V_{T1} = 1/9 V_{T0}$

When the above given formulae are applied to the table of voltage for channel selection given above, the following can be obtained in regard to the channels covered by the variable resistor (60);

| CHANNEL | | $V_{T0}$ | $\Delta V_{T1}$ | $V_{T0} + \Delta V_{T1}$ | $V_{T0} - \Delta V_{T1}$ |
|---|---|---|---|---|---|
| 1 | | 4(V) | 1.33(V) | 5.33(V) | 2.67(V) |
| 2 | | 6 | 2 | 8 | 4 |
| 3 | | 9 | 3 | 12 | 6 |
| 4 | (4) | | | | |
| | | 4.5 | 1.5 | 6 | 3 |
| 5 | (5) | | | | |
| 6 | (6) | | | | |
| | | 6.5 | 2.17 | 8.67 | 4.33 |
| 7 | (7) | | | | |

–Continued

| CHANNEL | $V_{T0}$ | $\Delta V_{T1}$ | $V_{T0}+\Delta V_{T1}$ | $V_{T0}-\Delta V_{T1}$ |
|---|---|---|---|---|
| 8 | (8.5) | | | |
| | 9.25 | 3.08 | 12.33 | 6.17 |
| 9 | (10) | | | |
| 10 | (12) | | | |
| | 13.5 | 4.5 | 18 | 9 |
| 11 | (15) | | | |
| 12 | 18 | 6 | 24 | 12 |
| 13 | (2.5) | | | |
| | 2.75 | 0.92 | 3.67 | 1.83 |
| 14 | (3.0) | | | |
| 15 | (3.5) | | | |
| | 3.75 | 1.25 | 5 | 2.5 |
| 16 | (4.0) | | | |
| 17 | (4.5) | | | |
| | 4.75 | 1.58 | 6.33 | 3.17 |
| 18 | (5) | | | |
| 19 | (5.5) | | | |
| 20 | (6) | | | |
| | 6.25 | 2.08 | 8.33 | 4.17 |
| 21 | (6.5) | | | |
| 22 | (7) | | | |
| ⋮ | ⋮ | ⋮ | ⋮ | ⋮ |
| 59 | (19.6) | | | |
| 60 | (20.4) | | | |
| | 20.8 | 6.9 | 27.7 | 13.9 |
| 61 | (21.2) | | | |
| 62 | (22) | | | |

As is apparent from the above table, when the variable resistor (60) is rotated completely once in VHF lower channels, Channel 1 can be covered, all and in VHF intermediate and higher channels, Channel 3 can be covered, and in UHF, Channels from 2 to 4 can be covered. Therefore, on comparison with conventional variable resistors wherein one revolution of the conventional variable resistor covers all the channels, in accordance with the present invention, the range to be covered is narrowed to remarkably improve the control precision of the respective variable resistors (45) ~ (51), and the preset control can be easily carried out. On the other hand, it suffices to provide only the number of variable resistors (46) ~ (51) of the same resistance corresponding to the number of required channels, and therefore it is possible to simplify the structure.

In the following paragraphs, the switching of AFC sensitivity is explained.

In FIG. 2, when it is presumed that the resistance of the variable resistor (60) is on the position of $R_{X\ max}$ as the typical position, the resistance of the variable resistor (60) is represented by the formula given below from the above description;

FORMULA $$R_X = \tfrac{1}{2} R_{X\ max} = \tfrac{1}{2} R_O = 1/6(R_B + R_C)$$

In the above mentioned formula, when the AFC voltage of the voltage source (62) is set to be E (V), the AFC voltage $V_{T2}$ applied to the variable-capacity element coming onto the channel selecting voltage output terminal (53) from the AFC voltage, is as follows;

FORMULA $$V_{T2} \doteq E[\{R_D + (R_B + 1/9R_C)R_C/R_B + R_C\}/\{R_E + R_D + (R_B + 1/9R_C)R_C/R_B + R_C\}]$$

In the above formula, $R_B = 3R_{01} - R_C$, and therefore the above given formula can be converted into the following formula;

FORMULA $$V_{T2} \doteq E[\{R_D + (1 - 8/27\ R_C/R_{01})R_C\}/\{R_E + R_D + (1 - 8/27\ R_C/R_{01})R_C\}]$$

Figure 4:
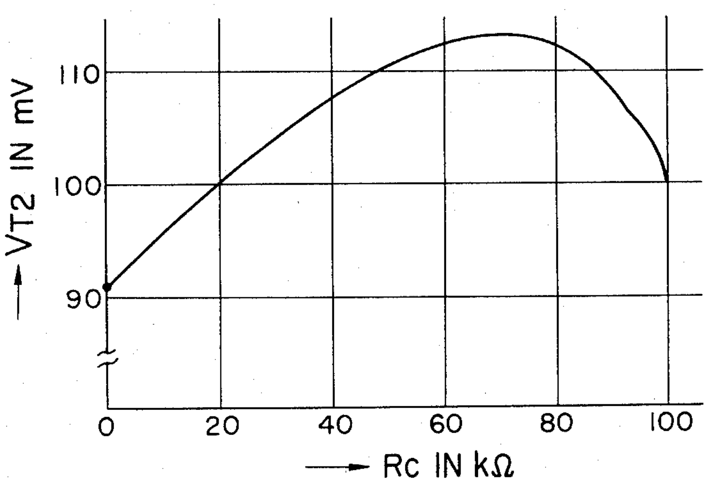
FIG. 4 is a graph of the characteristics of resistance slotted against AFC voltage for explaining the operation of the same device.

In order to simplify the explanation of the present invention, the above given formula is solved by presuming $R_{01}$ is 33 $K\Omega$, $R_E$ is 1 $M\Omega$, $R_D$ is 100 $K\Omega$, and $E$ is 1 $V$, it is apparent that the relation as shown in FIG. 4 is present between the resistance $R_C$ of the resistor (57) and the AFC voltage $V_{T2}$. In other words, AFC sensitivity is lowered when the resistance $R_C$ of the resistor (57) is larger or smaller than a certain value.

In the present invention, therefore, the resistor (19) is provided, and the resistance $R_D$ of the resistor (56) shown in the equivalent circuit of FIG. 2, in VHF higher channels, is made larger to compensate the lowering of AFC sensitivity. It will be easily understood from the above given formula and FIG. 4 that AFC sensitivity can be determined by the ratio of said two resistances when the resistance $R_E$ of the resistor (55) and the resistance $R_D$ of the resistor (56) are sufficiently large. On the other hand, in the aforesaid embodiment, the channels are grouped into four groups roughly. However, when they are grouped into more groups, and the resistor for compensation is provided, more precise compensation can be obtained.

In the following paragraphs, the switching operation of the tuning element of the electronic tuner is explained.

In an electronic tuner, switching is carried out for attaining the tuning of all the channels of VHF anad UHF in such a manner that a part or the whole of the tuning coils and a part or the whole of the additional capacity are electronically switched by using the switching element such as switching diode in accordance with the groups of VHF lower channel, VHF higher channels and UHF channels, and B voltage of UHF tuner, or VHF tuner is selectively added, to operate only one of the tuners.

In the embodiment shown in FIG. 1, the switch (2) performs the switching operation and when +B voltage is given to +B voltage input terminal (36), and –B voltage is given to –B voltage input terminal (38), the output voltages of VHF lower channels switching voltage output terminal (41), VHF higher channel switching controlling voltage output terminal (40) and UHF switching controlling voltage terminal (39) are as shown in the following table.

| | OUTPUT TERMINAL (39) | OUTPUT TERMINAL (40) | OUTPUT TERMINAL (41) |
|---|---|---|---|
| WHEN UHF CHANNEL IS RECEIVED | 0 (volt) | +B (volt) | −B (volt) |
| WHEN UHF HIGHER CHANNEL IS RECEIVED | 0 | +B | +B |
| WHEN UHF CHANNEL IS RECEIVED | +B | 0 | −B |

When, as UHF tuner and VHF tuner, separate tuners are used, any optional output of the VHF lower channel switching controlling voltage output terminal (41) can give no effect when UHF channels are received.

As is apparent from the above given table, when the circuit wherein the switch (2), +B voltage, −B voltage, resistor (37), and diode (42) are used, as is shown in FIG. 1, is adopted, it is possible to obtain the simple circuit structure for control voltage for switching the electronic tuner.

As described so far in the foregoing paragraphs, when the channel selecting voltage is predetermined, it is possible to remarkably easily carry out the control of channel selection by the adjustment of the fine-adjusting device after adjustment of the block voltage corresponding to the receiving channel. Further, the precise control thereof can be obtained by reducing the range which the device covers in its one revolution for fine adjustment. It suffices only to provide fine adjustment elements by the number equal to the number of the receiving channels on said device for fine adjustment and it is possible to provide a plural number of the same elements for fine adjustment on the whole channels, and therefore the structure can be remarkably simplified. As a result, the cost of the product can be considerably reduced. When the range to be covered by the fine adjustment element is determined to cover several channels, only one block voltage is sufficient for several channels and therefore the structure of the means for obtaining block voltage can be simplified.

In accordance with the present invention, it is possible to obtain excellent AFC characteristics always by the AFC sensitivity to be almost the same.

In accordance with the present invention, channels are divided into a plural number of groups and the resistors for compensation are provided per each group without requiring any extra contrivances and the structure of this invention is very simple, and with such a simple structure, sufficient advantages can be obtained.

Figure 5:
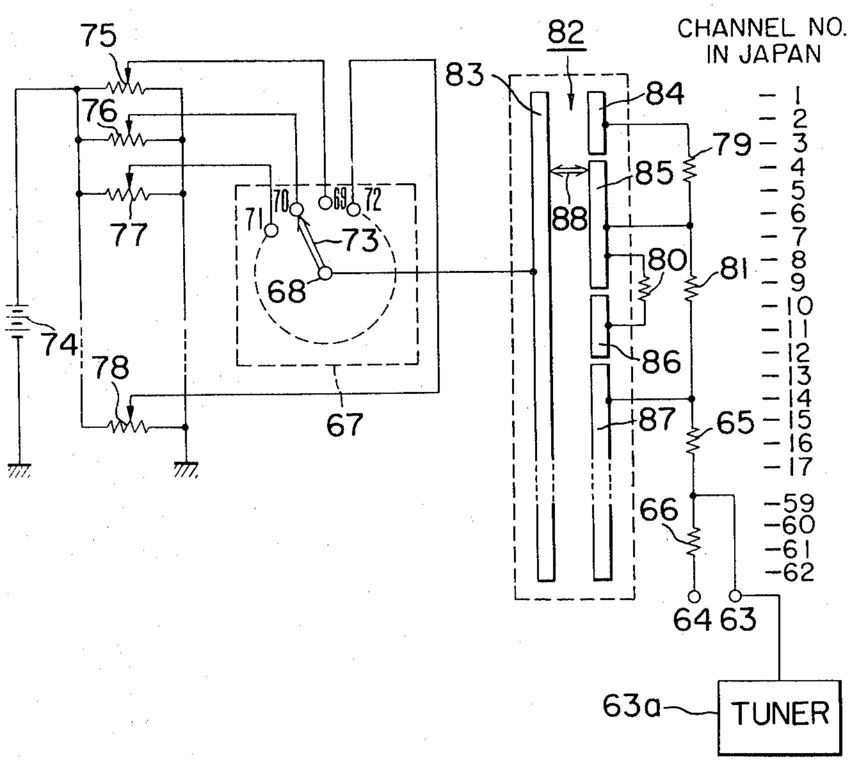
FIG. 5 is an electric circuit of the channel selector as another embodiment of this invention.

FIG. 5 shows the main portion of the channel selector for Japanese TV broadcasting as another embodiment of this invention and it is explained more in detail in the following paragraphs.

In FIG. 5, (82) is the first switch for channel selection, and has the common input terminal (83), output terminal (84) for VHF lower channels, the output terminal (85) for VHF intermediate channels, the output terminal (86) for VHF higher channels, the output terminal (87) for UHF, and the contact (88).

Said contact (88) can be controlled to stop on the positions corresponding to each of the whole channels, such as Channel 1, Channel 2, . . . , Channel 13, and Channel 14, etc., and for example, it is preset in such a manner that it can stop only on the desirable receiving channel position as Channel 2, Channel 4, Channel 7 when they are on broadcasting.

Such a presetting, as mentioned above, can be easily realized in such a manner that a switch interlocked with the first switch (82) and provided with separate terminals for the respective channel positions, is provided, and with said switch, stop signals (signals such as to detect whether or not voltage is given to the terminal, and such as to stop only on the channel position to which voltage is given) are produced to control the drive mechanism of the first switch (82) to stop only on the required receiving channel position.

Numerals (79), (80), (81) designate the resistors respectively connected between the output terminal (84) and the output terminal (85), between the output terminal (85) and the output terminal (86), and between the output terminal (85) and the output terminal (87), for compensation of AFC voltage. Numeral (63) designates the channel selecting voltage output terminal for taking out the channel selecting voltage to be given to the voltage variable-capacity element of the tuner (63a). Numeral (64) designates the voltage input terminal for AFC to receive AFC voltage and numerals (65) and (66) are the resistors to be connected between the output terminal (87) and the channel selecting voltage output terminal (63) and between the channel selecting output terminal (63) and AFC voltage input terminal (64). Numeral (67) designates the second switch for selecting a channel, and has one common output terminal (68), the individual terminals (69), (70), (72), and the contact (73), and said contact (73) is touching the individual terminal (69), and is driven pitch by pitch in the counter-clock direction to be touching the individual terminals (69), (70), (71), and (72) every time when contact (88) of the first switch (82) is rotated in one direction and stops, i.e., every time when it is switched to the next receiving channel by the first switch, and when the contact (88) of the first switch (82) is restored into the original state, contact (73) of the second switch (67) is also restored to its original state.

The above mentioned structure can be easily realized when the operation of the contact (73) of the second switch (67) is controlled by the above mentioned stop signal. The common output terminal (68) of the second switch (67) is connected to the common input terminal (83) of the first switch. Numeral (74) designates the power source for obtaining the channel selecting voltage and numerals (75), (76), (77), (78) designate the variable resistors for setting channel selecting voltage; one end of each of said variable resistors is connected to one end of the power source (74), the other end of each of said variable resistors is grounded, and the movable terminals thereof are connected to the respective terminals (69), (70), (71) and (72) of the second switch (67).

Thus, the respective voltage ratios are preset in such a manner that channel selecting voltage can be taken out by the channel selecting voltage output terminal (63) so that when the contact (88) of the first switch (82) stops on Channel 2 position, Channel 4 position, Channel 7 position . . . , Channel 60 position, in turn to receive the receiving channels, the variable resistor (75) can select Channel 2, the variable resistor (76) can select Channel 4, the variable resistor (77) can select Channel 7 in correspondence to the receiving channels where said contact (88) of the first switch stops.

In the above described structure, it is taken as an example that channel selecting voltage is directly taken out from the common output terminal (68) of the second switch (67) in accordance with the prior art without providing the first switch (82) and the resistors (79), (80), (81). AFC voltage given to the AFC voltage input terminal (64) is grounded through the movable terminals of the variable resistors (75), (76), (77), (78) and the resistance between the movable terminals of said variable resistors (75), (76), (77), (78) and the ground is set at a value necessitated to be varied in accordance with the receiving channels, and therefore the AFC voltage superposed on the channel selecting voltage of the channel selecting voltage output terminal (63) is changed according to each receiving channel. Thus AFC sensitivity is different depending on the receiving channels resulting in undesirable operation. However, in accordance with the above described structure of this invention, the voltage ratio of AFC voltages to the channel selecting voltage output terminal (63) and the impedance between AFC voltage input terminal (64) and the earth are controlled to be relatively constant on the respective receiving and the receiving channels are divided into several groups, such as VHF lower channels, VHF intermediate channels, VHF higher channels, and UHF channels, and the first switch having the output terminals (84), (85), (86), (87) for the respective groups for determining the particular group to which the now receiving channel belongs, is provided. Resistors (79), (80), (81) for compensation are provided between the movable terminals of the variable resistors (75), (76), (77), (78) and the terminal (64) of AFC voltage input terminal (64). By so doing, the difference of AFC sensitivity in each channel can be eliminated, and remarkably stable reception can be attained.

In the structure shown in the attached drawings, the channels are largely grouped and therefore there is more or less difference of AFC sensitivity in the respective groups, and yet the compensation can be effected to such a degree that the difference can be neglected from a practical point of view. It is a matter of fact that when finer compensations can be accomplished by increasing the number of groups of the channels, and more effective compensation can be accomplished by dividing the channels into greater number of groups. On the other hand, it is possible to make the compensation of AFC sensitivity by a remarkably simple structure only by newly providing the first switch (82) and the resistors (79), (80), and (81) in the above given structure.

Moreover, the first switch (82) has the position corresponding to all the channels, and when the channel indication is sought to be accomplished by using the first switch (82), the indications of all the channels can be accomplished, and therefore when compared with the conventional channel indication which is done only on a specific channel, i.e., the receiving channel only, in accordance with the channel indication of this invention, the presently receiving channel among the whole channels, can be recognized at one glance, and remarkably recognizable channel indication can be accomplished.

In the case of the conventional channel indication, the channel indicator must be replaced by a new one when the TV set is removed to a different district, and the receiving channel is changed, however, when the above described structure is adopted, it is not necessary to replace the channel indicator at all, and it suffices to change the selected channel position of the contact (88) of the first switch (82), and although in the adjustment of channel selecting voltages of the variable resistors (75), (76), (77) and (78), those of larger turn ratios are required. Thus compared with the embodiment of FIG. 1, the universality thereof against the change of receiving channels is very excellent.

As described in the foregoing paragraphs, in accordance with the present invention, it is posssible to provide a channel selector capable of always retaining constant AFC sensitivity, and to carry out channel indication excellently.

In the above given embodiments, TV broadcasting channels in Japan are taken as examples, but, of course, the present invention can be applied to TV broadcasting channels of any countries of the world.

In the claims, what is meant by the first switch, stands for the switch (1) of FIG. 1, and the switch (82) of FIG. 5, or those corresponding thereto, and what is meant by the second switch stands for the switch (43) of FIG. 1, the switch (67) of FIG. 5, and those corresponding thereto.

What is claimed is:

1. A channel selector comprising an electronic tuner utilizing a voltage-variable capacity element; means for generating a plural number of channel selecting voltages corresponding to the receiving channels; switch means having a plurality of groups of first terminals and a plurality of second terminals for connecting selected terminals of said first groups of terminals to selected ones of said second terminal, each of said second terminals thereby being associated with a group of said first terminal for receiving AFC voltages; means for connecting each of said generated channel selecting voltages to a separate terminal of said plurality of groups of first terminals; an AFC compensation resistance network having a plurality of taps and exhibiting different resistance values at each of said taps; means connecting each of said taps of said AFC compensation resistance network to separate ones of said second plurality of terminals of said switch means; means for connecting said AFC compensation resistance network to said tuner, and means connected to said AFC voltage receiving terminal and to said AFC compensation resistance network for superimposing said AFC voltages on said selected channel selection voltage.

2. Channel selector according to claim 1 wherein the means for generating a plural number of channel selecting voltages includes a set of variable resistors.

3. Channel selector according to claim 1 wherein the means for generating a plural number of channel selecting voltages includes means for generating a voltage corresponding respectively to each group of the receiving channels to be selected, and means for finely adjusting each voltage corresponding to the receiving channel to be selected.

4. Channel selector according to claim 2 wherein said switch means comprises a first switch for switching the AFC compensation resistors and a second switch interlocked with said first switch for switching said set of variable resistors.

5. Channel selector according to claim 3 wherein said switch means comprises a first switch for switching the AFC compensation resistors, and for switching said means for generating said voltage corresponding respectively to every group of the receiving channels to be selected, and wherein said channel selection generating means comprises a second switch for switching said means for generating said finely adjustable voltage, said first and second switches being interlocked.

6. Channel selector according to claim 5 wherein said second switch includes an output terminal, said plurality of groups of first terminals comprises individual terminals for respective channels, wherein said means for generating the voltages corresponding to the groups of channels to be selected comprises a plural number of resistors connected to the respective individual terminals and to the output terminal of said second switch.

7. A channel selector for providing channel selecting voltages, comprising first and second intercoupled switch means each having a number of positions corresponding to the number of channels to be selected, a selector output terminal, an input terminal for receiving an AFC voltage, a terminal for receiving an input voltage, said first switch means having a first plurality of terminals provided in positions corresponding to the respective receiving channels, and a second plurality of output terminals provided in positions corresponding to each group of receiving channels and connectable to the respective first plurality of terminals in the respective switch positions, a network of compensating AFC resistors connected to said selector output terminal and having a plurality of taps exhibiting different resistance values connected to said second plurality of output terminals, a separate voltage divider means connected to the terminals of the first plurality of terminals of each group of positions, a plurality of fine adjustment resistors, said second switch means selectively connecting said fine adjustment resistors between said terminal for receiving an input voltage and said voltage dividers, and resistor means for connecting said compensating AFC resistors of said second plurality of output terminals of the first switch means and said input terminal for receiving said AFC voltage.

8. A channel selector circuit for providing channel selecting voltages, comprising a selector output terminal, a terminal for receiving an AFC voltage, a terminal for receiving an input voltage, N adjustable resistors, wherein N is the number of channels to be selected, a plurality of parallel voltage dividers corresponding to different groups of channels, first switch means having N positions for selectively connecting said adjustable resistors between said terminal for receiving an input voltage and said parallel voltage dividers, a network of AFC compensating resistors having a plurality of taps exhibiting different resistance values, second switch means intercoupled with said first switch means and also having N positions, said second switch means having N input terminals separated into groups of terminals connected to different voltage dividers, and means selectively connecting said taps of said AFC resistor network to said input terminals of said second switch whereby each AFC resistor network tap is selectively connected to the input terminals of a separate group of input terminals at the corresponding switch position, and resistor means for connecting the AFC resistor network to said terminal for receiving said AFC voltage.

* * * * *

UNITED STATES PATENT OFFICE
CERTIFICATE OF CORRECTION

Patent No. 3,868,609 Dated February 25, 1975

Inventor(s) Yukio Konyanagi

It is certified that error appears in the above-identified patent and that said Letters Patent are hereby corrected as shown below:

On the Title Page, left hand column, under
"Foreign Application Priority Date", after
"October 19, 1971 Japan...46/83186" insert
-- October 19, 1971 Japan...46/83187
October 19, 1971 Japan...46-83188 --.

Column 1, line 22, after "contacts" add -- of --;
line 25, after "structure" add -- of --.

UNITED STATES PATENT OFFICE

CERTIFICATE OF CORRECTION

Patent No. 3,868,609 Dated February 25, 1975

Inventor(s) Yukio Koyanagi

It is certified that error appears in the above-identified patent and that said Letters Patent are hereby corrected as shown below:

Column 8, line 53, change "anad" to -- and --.

Column 9, line 50, after "by" add -- controlling --.

Column 10, line 36, change ", and said contact" to -- . Contact --.

IN THE CLAIMS:

Claim 1, line 54, after "voltage" add -- whereby a channel compensated selecting voltage is connected to a tuner for compensating the AFC sensitivity --.

UNITED STATES PATENT OFFICE

CERTIFICATE OF CORRECTION

Patent No. 3,868,609 Dated February 25, 1975

Inventor(s) Yukio Koyanagi

It is certified that error appears in the above-identified patent and that said Letters Patent are hereby corrected as shown below:

Claim 7, (Column 14), line 10, after "voltage" add -- whereby a channel compensated selecting voltage is connected to a tuner for compensating the AFC sensitivity --.

Claim 8, line 33, after "voltage" add -- whereby a channel compensated selecting voltage is connected to a tuner for compensating the AFC sensitivity --.

Signed and Sealed this

*fourteenth* Day of *October 1975*

[SEAL]

*Attest:*

RUTH C. MASON
*Attesting Officer*

C. MARSHALL DANN
*Commissioner of Patents and Trademarks*

UNITED STATES PATENT OFFICE
CERTIFICATE OF CORRECTION

Patent No. 3,868,609 Dated February 25, 1975

Inventor(s) Yukio Koyangi

It is certified that error appears in the above-identified patent and that said Letters Patent are hereby corrected as shown below:

Column 6, line 10: Cancel the line and substitute:

$$-- V_{T1} \doteq V_0 \doteq 30 \cdot \frac{R_{01}}{R_X + R_{01}} \cdot \frac{R_C}{R_B + R_C} --$$

lines 18 and 19: Cancel the lines and substitute:

$$-- V_{T1}\ max = 30 \cdot \frac{R_C}{R_B + R_C}$$

$$V_{T1}\ min = 30 \cdot 1/2 \cdot \frac{R_C}{R_B + R_C} --$$

line 50: Cancel the line and substitute:

$$-- \frac{V_{T0} + \Delta V_{T1}}{V_{T0} - \Delta V_{T1}} = \frac{V_{T1}\ max}{V_{T1}\ min} = 2 --$$

Column 7, lines 60 and 61: Cancel the lines and substitute:

$$-- V_{T2} \doteq E\left[\left\{R_D + \frac{(R_B + 1/9R_C)R_C}{R_B + R_C}\right\} / \left\{R_E + R_D + \frac{(R_B + 1/9R_C)R_C}{R_B + R_C}\right\}\right] --$$

UNITED STATES PATENT OFFICE
CERTIFICATE OF CORRECTION

Patent No. 3,868,609 Dated February 25, 1975

Inventor(s) Yukio Koyangi Page 2

It is certified that error appears in the above-identified patent and that said Letters Patent are hereby corrected as shown below:

Column 7, lines 66 and 67: Cancel the lines and substitute:

-- $V_{T2} \doteqdot E[\{R_D + (1 - 8/27\ R_C/R_{01})R_C\} / \{R_E + R_D + (1-8/27\ R_C/R_{01})R_C\}]$ --

On the title page: Change the inventor's name from "Koyangi" to --Koyanagi--.

Signed and Sealed this

*eighteenth* Day of *November 1975*

[SEAL]

*Attest:*

RUTH C. MASON
*Attesting Officer*

C. MARSHALL DANN
*Commissioner of Patents and Trademarks*